United States Patent
Watanabe et al.

(10) Patent No.: US 6,947,309 B2
(45) Date of Patent: Sep. 20, 2005

(54) FERROELECTRIC MEMORY DEVICE (75) Inventors: Kenya Watanabe, Suwa (JP); Mitsuhiro Yamamura, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/822,807

(22) Filed: Apr. 13, 2004

(65) Prior Publication Data

US 2005/0002216 A1 Jan. 6, 2005

(30) Foreign Application Priority Data

Apr. 15, 2003 (JP) ................................ 2003-110400

(51) Int. Cl.$^7$ ............................................. G11C 11/22
(52) U.S. Cl. ................... 365/145; 365/63; 365/230.03
(58) Field of Search ..................... 365/145, 63, 149, 365/230.03

(56) References Cited

U.S. PATENT DOCUMENTS

| | | | |
|---|---|---|---|
| 6,791,861 B2 * | 9/2004 | Kang et al. ............... | 365/145 |
| 6,826,097 B2 * | 11/2004 | Kang ........................ | 365/196 |
| 6,845,031 B2 * | 1/2005 | Kang et al. ............... | 365/145 |
| 6,873,536 B2 * | 3/2005 | Komatsuzaki ............ | 365/145 |

FOREIGN PATENT DOCUMENTS

| | | |
|---|---|---|
| JP | A 7-235648 | 9/1995 |
| JP | A 9-116107 | 5/1997 |

OTHER PUBLICATIONS

U.S. Appl. No. 10/747,395, filed Dec. 30, 2003, Maruyama.
U.S. Appl. No. 10/747,523, filed Dec. 30, 2003, Maruyama.
U.S. Appl. No. 10/754,691, filed Jan. 12, 2004, Maruyama.
U.S. Appl. No. 10/737,959, filed Dec. 18, 2003, Maruyama.
U.S. Appl. No. 10/752,184, filed Jan. 7, 2004, Maruyama.
U.S. Appl. No. 10/758,179, filed Jan. 16, 2004, Yamamura.
U.S. Appl. No. 10/807,355, filed Mar. 24, 2004, Karasawa et al.
U.S. Appl. No. 10/816,854, filed Apr. 5, 2004, Yamamura.

* cited by examiner

Primary Examiner—Son T. Dinh
(74) Attorney, Agent, or Firm—Oliff & Berridge, PLC (57) ABSTRACT A ferroelectric memory device, in which wordlines and bitlines are hierarchized and influence of disturbance-noise is reduced, includes: first sub-wordline select switches, each of which are disposed between one of the main-wordlines and one end of one of the sub-wordlines provided for the one main-wordline; first sub-bitline select switches, each of which are disposed between one of the main-bitlines and one end of one of the sub-bitlines provided for the one main-bitline; second sub-wordline select switches, each of which are disposed between the other end of one of the sub-wordlines and the unselected wordline potential supply line; and second sub-bitline select switches, each of which are disposed between the other end of one of the sub-bitlines and the unselected bitline potential supply line, each of the first and second sub-wordline select switches and first and second sub-bitline select switches being driven independently at least in one of the sector regions.

17 Claims, 10 Drawing Sheets

FERROELECTRIC MEMORY DEVICE

Japanese Patent Application No. 2003-110400, filed on Apr. 15, 2003, is hereby incorporated by reference in its entirety.

BACKGROUND OF THE INVENTION

The present invention relates to a ferroelectric memory device.

As a ferroelectric memory device, an active ferroelectric memory device including a 1T/1C cell in which one transistor and one capacitor (ferroelectric) are disposed in each memory cell, or including a 2T/2C cell in which a reference cell is further disposed in each memory cell, has been known.

However, since the active ferroelectric memory device has a large memory area in comparison with a flash memory or EEPROM, which is known as a nonvolatile memory device in which a memory cell is formed by one element, the capacity cannot be increased.

A ferroelectric memory device in which each memory cell is formed by one ferroelectric capacitor is known (Japanese Patent Application Laid-open No. 9-116107). Japanese Patent Application Laid-open No. 9-116107 discloses hierarchization of a bitline. Specifically, a plurality of sub-bitlines through a plurality of connection means are provided for one main-bitline. When one of the connection means is turned on, one main-bitline can be connected with one sub-bitline selected by turning on the connection means. This prevents voltage from being applied to the unselected memory cells connected with other sub-bitlines, whereby the number of disturbances applied to the unselected memory cells can be limited.

However, the sub-bitline connected with the connection means that has been turned off floats. The interconnect potential changes if noise is applied from the outside, whereby data stored in the ferroelectric capacitor connected with the sub-bitline may be destroyed.

Japanese Patent Application Laid-open No. 7-235648 discloses a ferroelectric memory device which includes a plurality of sectors divided in units of sub-bitlines and in which each sector is further divided into a plurality of sub-sectors. The sector selected from among the plurality of sectors (selected sector) is divided into a selected sub-sector and an unselected sub-sector. In the selected sector, the sub-bitlines do not float in both the selected sub-sector and the unselected sub-sector.

However, the potential of the sub-bitline is in a floating state in all the unselected sub-sectors in the unselected sector.

BRIEF SUMMARY OF THE INVENTION

A ferroelectric memory device that is less affected by noise may be provided without making sub-bitlines and/or sub-wordlines connected to an unselected memory cell float while hierarchizing wordlines and/or bitlines.

A ferroelectric memory device according to one aspect of the present invention includes a memory cell array region divided into a plurality of sector regions in row and column directions. Wordlines and bitlines are hierarchized in this memory cell array regions In other words, the ferroelectric memory device includes: a plurality of main-wordlines disposed in the memory cell array region in parallel along the row direction; a plurality of main-bitlines disposed in the memory cell array region in parallel along the column direction; a plurality of sub-wordlines, each of the sub-wordlines being provided for one of the main-wordlines in one of the sector regions; a plurality of sub-bitlines, each of the sub-bitlines being provided for one of the main-bitlines in one of the sector regions; and a plurality of ferroelectric memory cells, each of the ferroelectric memory cells being disposed at an intersecting point of one of the sub-wordlines provided for one of the main-wordlines and one of the sub-bitlines provided for one of the main-bitlines.

This ferroelectric memory device further includes: a plurality of first sub-wordline select switches, each of the first sub-wordline select switches being disposed between one of the main-wordlines and one end of one of the sub-wordlines provided for the one main-wordline and being driven independently at least in one of the sector regions; and a plurality of first sub-bitline select switches, each of the fist sub-bitline select switches being disposed between one of the main-bitlines and one end of one of the sub-bitlines provided for the one main-bitline and being driven independently at least in one of the sector regions.

This ferroelectric memory device further includes: at least one unselected wordline potential supply line which supplies an unselected wordline potential to the sub-wordlines; at least one unselected bitline potential supply line which supplies an unselected bitline potential to the sub-bitlines; a plurality of second sub-wordline select switches, each of the second sub-wordline select switches being disposed between the other end of one of the sub-wordlines and the unselected wordline potential supply line and being driven independently at least in one of the sector regions; and a plurality of second sub-bitline select switches, each of the second sub-bitline select switches being disposed between the other end of one of the sub-bitlines and the unselected bitline potential supply line and being driven independently at least in one of the sector regions.

Since the wordlines and tile bitlines are hierarchized, parasitic capacitance of the wordlines and the bitlines is reduced during the drive period, whereby a read voltage can be increased. Moreover, the sub-wordlines and the sub-bitlines can be prevented from floating by complementarily driving the switches provided on both ends of the sub-wordline and the sub-bitline. Since these switches can be driven independently, a selected wordline potential and a selected bitline potential can be supplied to only a sub-wordline and a sub-bitline connected with the selected memory cell.

This ferroelectric memory device may further include: a plurality of first sector select sections, each of the first sector select sections being provided for the sector regions arranged along the column direction; and a plurality of second sector select sections, each of the second sector select sections being provided for the sector regions arranged along the row direction. In this case, when a selected first sector select section is selected from among the plurality of first sector select sections and a selected second sector select section is selected from among the plurality of second sector select sections, the selected first sector select section and the selected second sector select section may turn on and turn off the first and second sub-wordline select switches and the first and second sub-bitline select switches so that a select voltage is applied to a selected memory cell in a selected sector region through one of the main-wordlines and one of the main-bitlines, and may turn on and turn off the first and second sub-wordline select switches and the first and second sub-bitline select switches so that an unselect voltage is applied to an unselected memory cell in the selected sector region through at least one of the unselected wordline potential supply line and the unselected bitline potential supply line, the selected memory cell and the un selected memory cell being memory cells among the plurality of the ferroelectric memory cells, and the selected sector region being selected from among the plurality of the sector regions.

More specifically, the selected first sector select section may turn on one of the first sub-wordline select switches that is connected with one of the sub-wordlines provided for the selected memory cell and may turn off rest of the first sub-wordline select switches in the selected sector region, and may turn on one of the second sub-wordline select switches that is connected with one of the sub-wordlines provided for the selected memory cell and may turn off rest of the second sub-wordline select switches in the selected sector region. The selected second sector select section may turn on one of the first sub-bitline select switches that is connected with one of the sub-bitlines provided for the selected memory cell and may turn off rest of the first sub-bitline select switches in the selected sector region, and may turn on one of the second sub-bitline select switches that is connected with one of the sub-bitlines provided for the selected memory cell and may turn off rest of the second sub-bitline select switches in the selected sector region.

One of the first sector select sections provided for an unselected sector region that shares one of the main-wordlines with the selected sector region may turn off the first sub-wordline select switches and may turn on the second sub-wordline select switches, the unselected sector region being a sector region other than the selected sector regions among the plurality of the sector regions. This prevents the selected wordline potential supplied to the main-wordline from being supplied to the unselected sector region, whereby the unselected wordline potential can be supplied.

One of the second sector select sections provided for an unselected sector region that shares one of the main-bitlines with the selected sector region may turn off the first sub-bitline select switches and may turn on the second sub-bitline select switches, the unselected sector region being a sector region other than the selected sector regions among the plurality of the sector regions. This prevents the selected bitline potential supplied to the main-bitline from being supplied to the unselected sector region, whereby the unselected bitline potential can be supplied.

The first sector select section provided for an unselected sector region that does not share one of the main-wordlines and one of the main-bitlines with the selected sector region may turn off the first sub-wordline select switches and may turn on the second sub-wordline select switches, the unselected sector region being a sector region other than the selected sector region among the plurality of sector regions. The second sector select section provided for an unselected sector region that does not share one of the main-wordlines and one of the main-bitlines with the selected sector region may turn off the first sub-bitline select switches and may turn on the second sub-bitline select switches, the unselected sector region being a sector region other tan the selected sector region among the plurality of sector regions. This enables only the unselected wordline potential and the unselected bitline potential to be supplied to the unselected sector region.

In any of the above aspects, if potentials of the sub-wordlines and the sub-bitlines connected with all of the unselected memory cells in the unselected sector region are substantially the same, 0 V can be applied to all of the unselected memory cells in the unselected sector, whereby occurrence of disturbance can be prevented.

During a standby period in which none of the sector regions are selected, the first sub-bitline select switches and the first sub-wordline select switches may be turned off, and the second sub-bitline select switches and the second sub-wordline select switches may be turned on in all of the sector regions. If potentials of the unselected wordline potential supply line and the unselected bitline potential supply line are substantially the same during the standby period, a disturbance voltage can be prevented from being applied to the memory cells during the standby period.

During an inspection period, the first sub-bitline select switches and the first sub-wordline select switches may be turned on, and the second sub-bitline select switches and the second sub-wordline select switches may be turned off in a sector region that is a target of inspection among the plurality of the sector regions. This enables "0" or "1" to be simultaneously written into all of the memory cells in the sector region.

The first sub-bitline select switches, the first sub-wordline select switches, the second sub-bitline select switches, and the second sub-wordline select switches may be turned off in a defective sector region among the plurality of the sector regions. This causes the defective sector region to be in a high impedance state, whereby occurrence of a leakage or the like can be prevented.

With this ferroelectric memory device, the unselected wordline potential supply lines may include: a variable unselected wordline potential supply line which supplies a variable unselected wordline potential to the sub-wordlines; and a fixed unselected wordline potential supply line which supplies a fixed unselected wordline potential to the sub-wordlines, and the unselected bitline potential supply lines may include: a variable unselected bitline potential supply line which supplies a variable unselected bitline potential to the sub-bitlines; and a fixed unselected bitline potential supply line which supplies a fixed unselected bitline potential to the sub-bitlines. The ferroelectric memory device may further include: a plurality of unselected wordline potential select switches which are provided for the sector regions arranged in the column direction and select one of the variable and fixed unselected wordline potential supply lines; and a plurality of unselected bitline potential select switches which are provided for the sector regions arranged in the Tow direction and select one of the variable and fixed unselected bitline potential supply lines.

DETAILED DESCRIPTION OF THE EMBODIMENT

1. Entire Configuration

Figure 1:
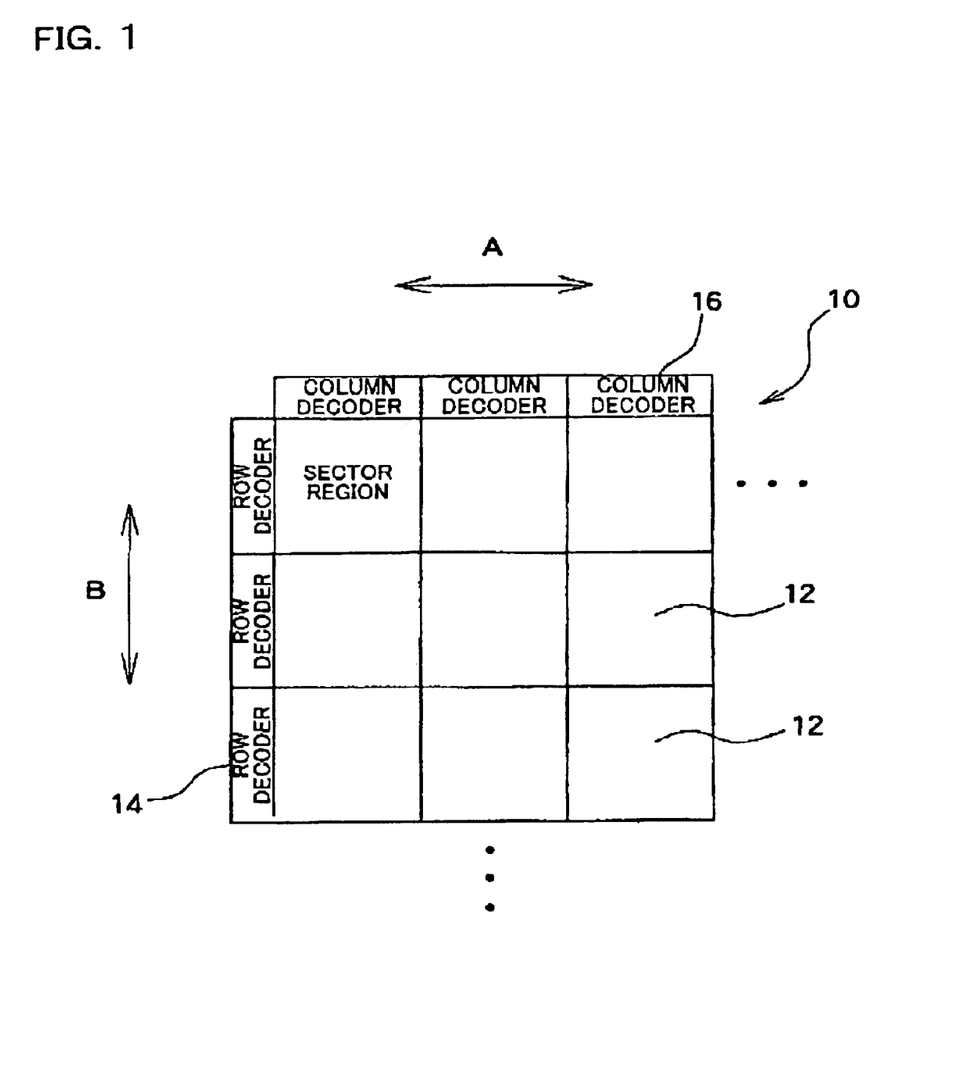
FIG. 1 is a planar layout of a ferroelectric memory device according to an embodiment of the present invention.
Figure 2:
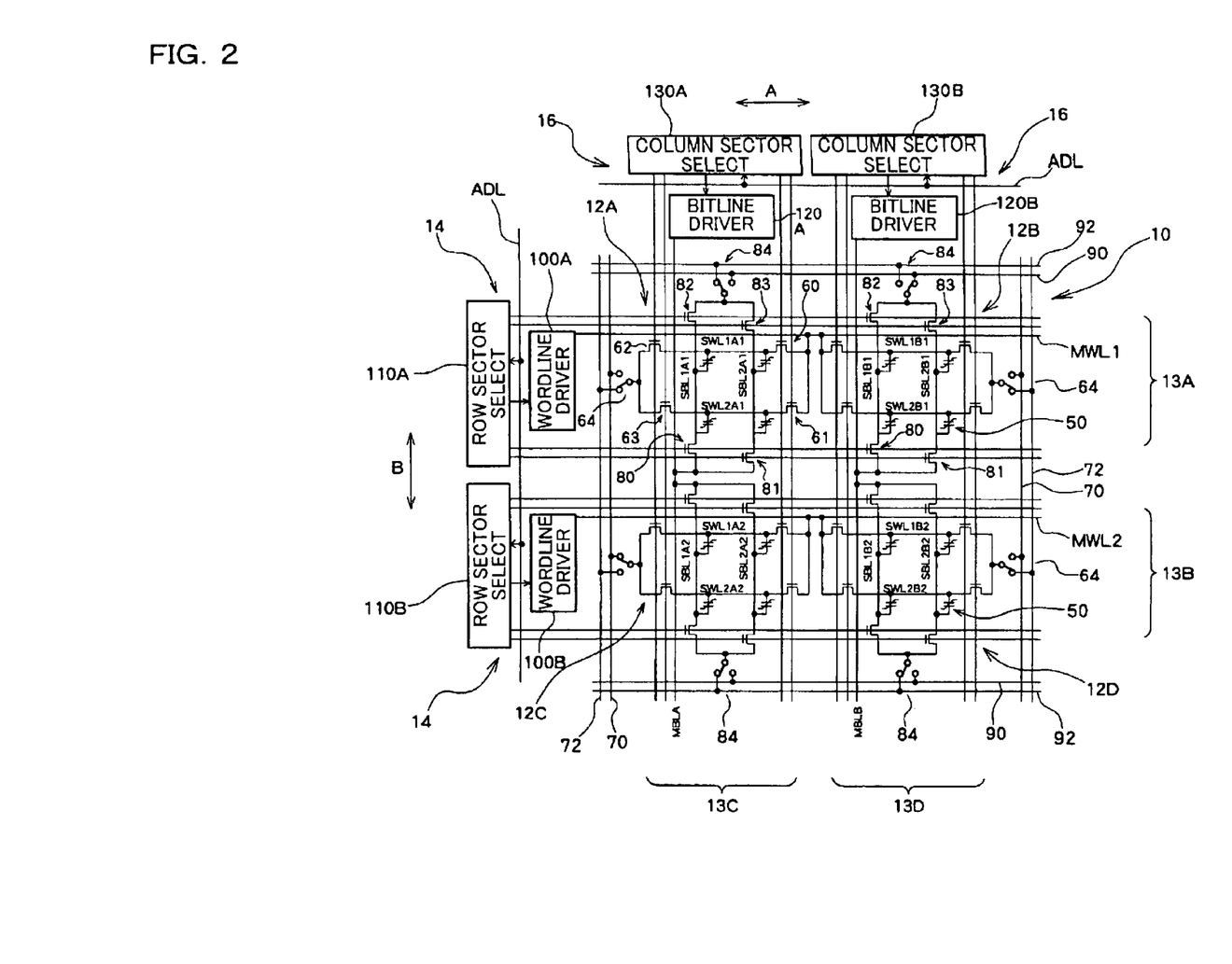
FIG. 2 is a schematic diagram describing four sector regions shown in FIG. 1 and peripheral circuits for the sector regions.

FIG. 1 shows a planar layout of a ferroelectric memory device according to an embodiment of the present invention. A memory cell array region 10 shown in FIG. 1 is divided into a plurality of sectors regions 12 in a row direction A and a column direction B. A row decoder 14 is disposed on one end of the memory cell array region 10 in the row direction A, for example. A column decoder 16 is disposed on one end of the memory cell array region 10 in the column direction B, for example FIG. 2 shows four sector regions 12 (12A to 12D) which are a part of tile memory cell array region 10 shown in FIG. 1. FIG. 2 shows an example in which the sector region 12 is simplified to the greatest extent In FIG. 2, one main-wordline MWL and a plurality of (two, for example) sub-wordlines SWL provided for the main-wordline MWL are disposed in one sector region 12. One main-bitline MBL and a plurality of (two, for example) sub-bitlines SBL provided for the main-bitline MBL are disposed in one sector region 12.

A memory cell 50 consisting of a ferroelectric capacitor is disposed at the intersecting point of the sub-wordline SWL and the sub-bitline SBL.

The sector regions 12A and 12B in one row are called a row sector 13A, and the sector regions 12C and 12D in the other row are called a row sector 13B. The sector regions 12A and 12C in one column are called a column sector 13C, and the sector regions 12B and 12D in the other column are called a column sector 13D.

Wordline driver sections 100A and 100B and row sector select circuits 110A and 110B are respectively provided corresponding to the row sectors 13A and 13B. Bitline driver sections 120A and 120B and column sector select circuits 130A and 130B are respectively provided corresponding to the column sectors 13C and 13D.

2. Memory Cell Array Region

The memory cell array region 10 is described below. In the present embodiment, the wordline WL and the bitline BL are hierarchized. Specifically, the sub-wordlines SWL1A1 and SWL2A1 are provided for the main-wordline MWL1 in the sector region 12A, for example. The sub-bitlines SBL1A1 and SBL2A1 are provided for the main-bitline MBLA in the sector region 12A. This also applies to other sector regions 12B to 12D.

In the sector region 12A, first sub-wordline select switches 60 and 61, which are independently driven, are respectively provided between the main-wordline MWL1 and one end of the sub-wordlines SWL1A1 and SWL2A1 provided for the main-wordline MWL1. A fixed unselected wordline potential supply line 70 which supplies a fixed unselected wordline potential to the sub-wordlines SWL1A1 and SWL2A1, and a variable unselected wordline potential supply line 72 which supplies a variable unselected wordline potential to the sub-wordlines SWL1A1 and SWL2A1 are provided. A first select switch 64 (unselected wordline potential select switch), which selects one of the fixed and variable unselected wordline potential lines 70 and 72, is provided.

Second sub-wordline select switches 62 and 63 are respectively provided between the other end of the sub-wordlines SWL1A1 and SWL2A1 and the first select switch 64. During the normal drive period, the first and second sub-wordline select switches 60 and 62 (or 61 and 63) connected with either end of one sub-wordline SWL are driven complementarily so that one of the first and second sub-wordline select switches is tired on while the other is turned off. Therefore, the sub-wordline SWL1A1 is connected with the main-wordline MWL1 when the first sub-wordline select switch 60 is turned on, and connected with the fixed unselected wordline potential supply line 70 or the variable unselected wordline potential supply line 72 through the first select switch 64 when the second sub-wordline select switch 62 is turned on. This prevents the sub-wordline SWL1A1 from floating.

In the sector region 12A, first sub-bitline select switches 80 and 81, which are independently driven, are respectively provided between the main-bitline MBLA and one end of the sub-bitlines SBL1A1 and SBL2A1 provided for the main-bitline MBLA. A fixed unselected bitline potential supply line 90 which supplies a fixed unselected bitline potential to the sub-bitlines SBL1A1 and SBL2A1, and a variable unselected bitline potential supply line 92 which supplies a variable unselected bitline potential to the sub-bitlines SBL1A1 and SBL2A1 are provided. A second select switch 84 (unselected bitline potential select switch), which selects one of the fixed and variable unselected bitline potential lines 90 and 92, is provided.

Second sub-bitline select switches 82 and 83 are respectively provided between the other end of the sub-bitlines SBL1A1 and SBL2A1 and the second select switch 84. During the normal drive period, the first and second sub-bitline select switches 80 and 82 (or 81 and 83) connected with either end of one sub-bitline SBL are driven complementarily so that one of the first and second sub-bitline select switches is turned on while the other is turned off. Therefore, the sub-bitline SBL1A1 is connected with the main-bitline MBLA when the first sub-bitline select switch 80 is turned on, and connected with the fixed unselected bitline potential supply line 90 or the variable unselected bitline potential supply line 92 through the second select switch 84 when the second sub-bitline select switch 82 is turned on This prevents the sub-bitline SBL1A1 from floating.

3. Driver Circuit

Figure 3:
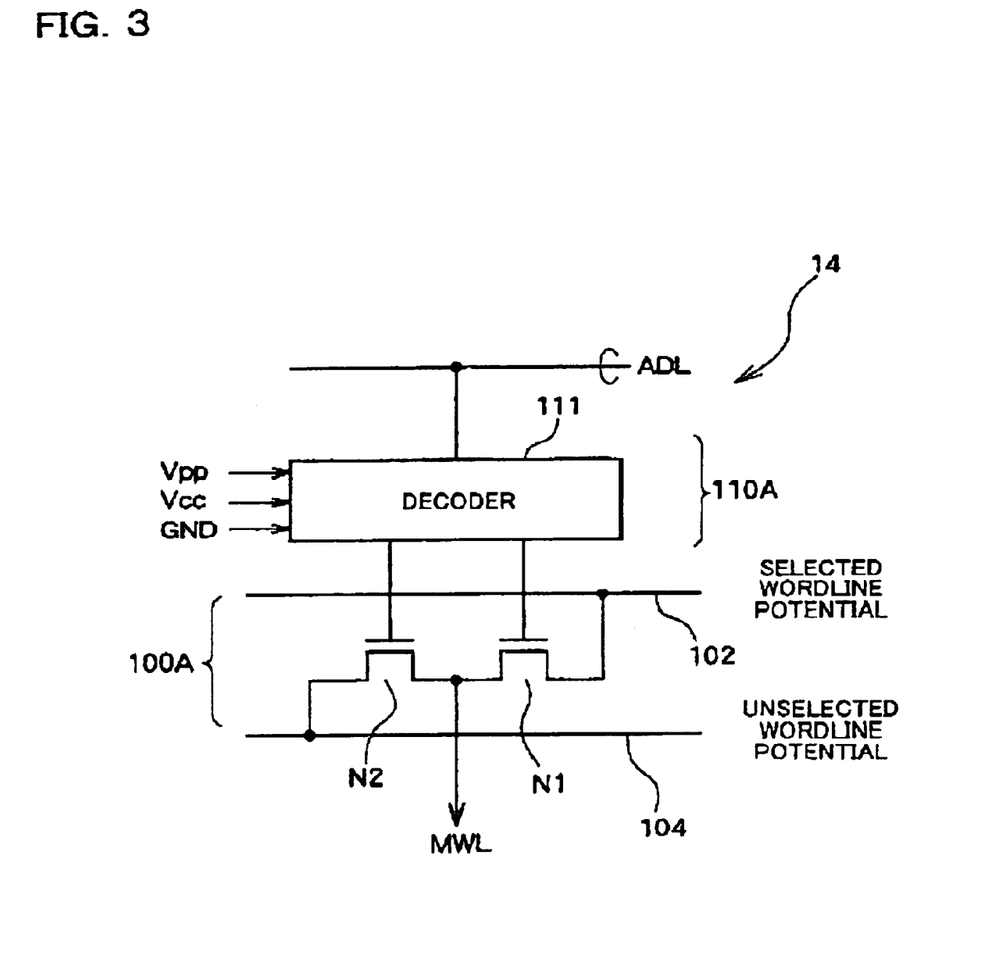
FIG. 3 is a circuit diagram showing a part of a row or column decoder according to an embodiment of the present invention.

FIG. 3 shows circuits which make up a part of the wordline driver section 100A and the row sector select circuit 110A shown in FIG. 2. As shown in FIG. 3, the row sector select circuit 110A includes a decoder circuit 111 which decodes signals from a plurality of address signal lines ADL. The wordline driver section 100A includes an N-type transistor N1 connected with a selected wordline potential supply line 102, and an N-type transistor N2 connected with an unselected wordline potential supply line 104. Drains of the transistors N1 and N2 are connected with the main-wordline MBL.

The transistors N1 and N2 are complementarily driven by the decoder circuit 111, whereby a selected wordline potential or an unselected wordline potential is supplied to the main-wordline MWL. The bitline driver section and the column sector select circuit are formed in the same manner as the wordline driver section and the row sector select circuit.

A voltage Vpp higher than a power supply voltage Vcc is supplied to gates of the transistors N1 and N2 in order to reduce a voltage loss in the transistors N1 and N2. Therefore, the size of the transistors N1 and N2 is increased. However, it suffices that one wordline driver section be provided for each of the row sectors 13A and 13B as shown in FIG. 2. Therefore, an increase in the integration of the memory device is not hindered.

The row sector select circuits 110A and 110B and the column sector select circuits 130A and 130B control switching of the switches 60 to 64 and 80 to 84 based on the address signals.

4. Principle of Ferroelectric Capacitor

A ferroelectric memory device is a memory device which utilizes two polarization states which appear in the hysteresis phenomenon of the ferroelectric capacitor 50 as one bit.

Figure 4:
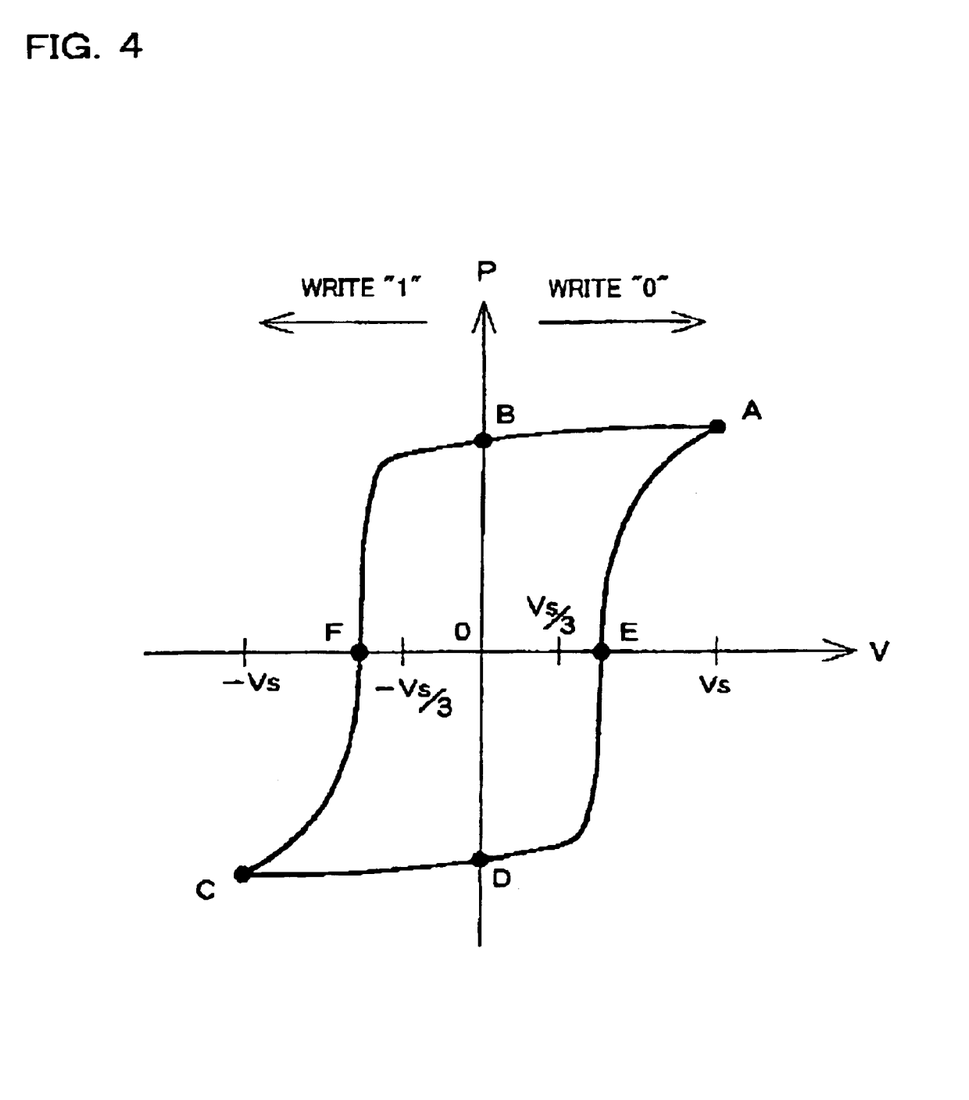
FIG. 4 shows a hysteresis phenomenon of a ferroelectric.

The hysteresis phenomenon is described below. FIG. 4 shows the correlation between the voltage applied to the ferroelectric and the polarization of the ferroelectric. In FIG. 4, the vertical axis P indicates the polarization of the ferroelectric, and the horizontal axis V indicates the voltage applied to the ferroelectric. The curve shown in FIG. 4 shows characteristics in which the polarization state of the ferroelectric capacitor 50 cycles corresponding to the change in the voltage applied to the ferroelectric capacitor 50. For example, when a select voltage Vs is applied to the ferroelectric capacitor 50 which is in a state at a point B (memory state of "0") or in a state at a point D (memory state of "1"), the polarization state transitions to a point A (read "0" or "1" or write "0"). When the applied voltage is changed to 0 V, the polarization state transitions to the point B. Specifically, the polarization state which is originally at the point D also transitions to the point B through the point A. When a select voltage -Vs is applied to the ferroelectric capacitor 50, the polarization state transitions to a point C (write "1" or rewrite). When the applied voltage is changed to 0 V, the polarization state transitions to the point D (memory state of "1").

An unselect voltage ±Vs/3 is applied to the ferroelectric capacitor 50 in the polarization state at the point B or D. When the applied voltage is changed to 0 V, the polarization state returns to the original point B or D. This shows that the memory state is maintained even if the unselect voltage ±Vs/3 is applied to the unselected ferroelectric capacitors 50 during the select period of one ferroelectric capacitor 50.

In order to realize the above-described drive operation, six types of potentials consisting of a selected wordline potential, a variable unselected wordline potential, a selected bitline potential, a variable unselected bitline potential, a fixed unselected wordline potential, and a fixed unselected bitline potential are generated for the sub-wordline SWL and the sub-bitline SBL, as shown in FIGS. 5A to 5F.

Figure 5A:
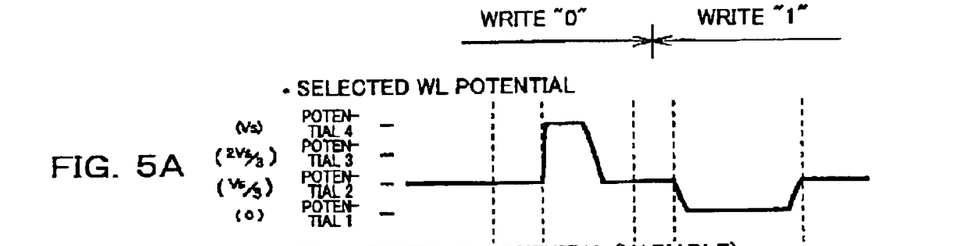
FIG. 5A shows a drive waveform according to an embodiment of the present invention.
Figure 5B:
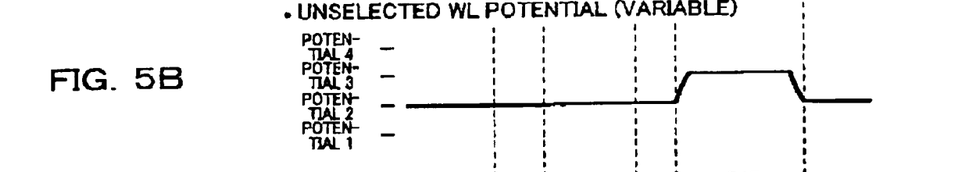
FIG. 5B shows another drive waveform according to an embodiment of the present invention.
Figure 5C:
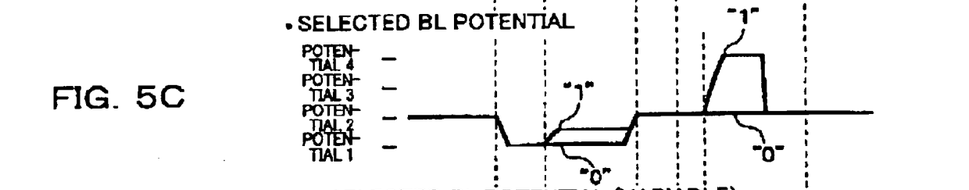
FIG. 5C shows a further drive waveform according to an embodiment of the present invention.
Figure 5D:
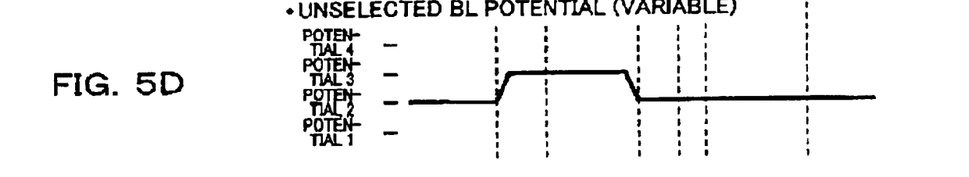
FIG. 5D shows a still further drive waveform according to an embodiment of the present invention.
Figure 5E:
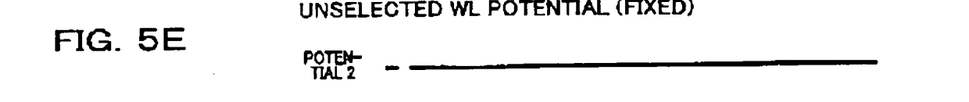
FIG. 5E shows a yet further drive waveform according to an embodiment of the present invention.
Figure 5F:
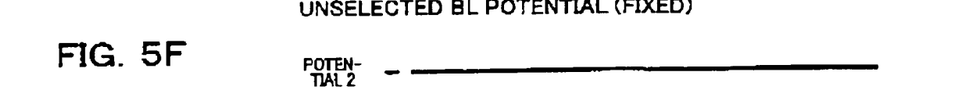
FIG. 5F shows an even firmer drive waveform according to an embodiment of the present invention.

The selected wordline potential shown in FIG. 5A, the unselected wordline potential shown in FIG. 5B, or the fixed unselected wordline potential shown in FIG. 5E is supplied to the main-wordline MWL shown in FIG. 2. The fixed unselected wordline potential supply line 70 is fixed at the fixed unselected wordline potential shown in FIG. 5E. The variable unselected wordline potential shown in FIG. 5B is supplied to the variable unselected wordline potential supply line 72. The selected bitline potential shown in FIG. 5C, the unselected bitline potential shown in FIG. 5D, or the fixed unselected bitline potential shown in FIG. 5F is supplied to the main-bitline MBL shown in FIG. 2. The fixed unselected bitline potential supply line 90 is fixed at the fixed unselected bitline potential shown in FIG. 5F. The variable unselected bitline potential shown in FIG. 5D is supplied to the variable unselected bitline potential supply line 92.

5. Description of Operation and Effect

Figure 6A:
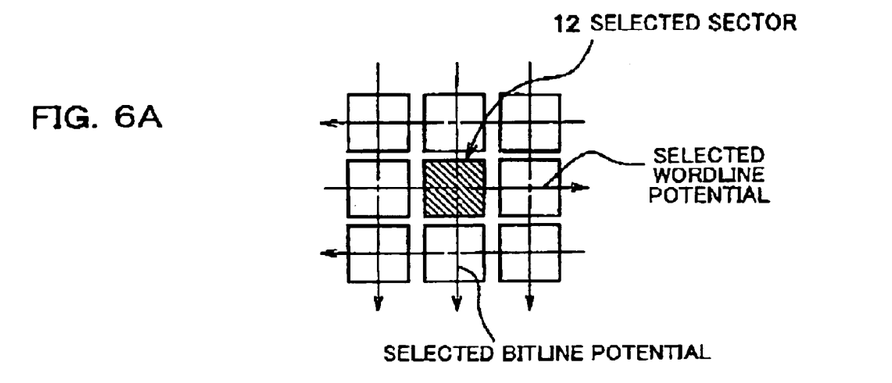
FIG. 6A shows the position of a selected sector according to an embodiment of the present invention.
Figure 6B:
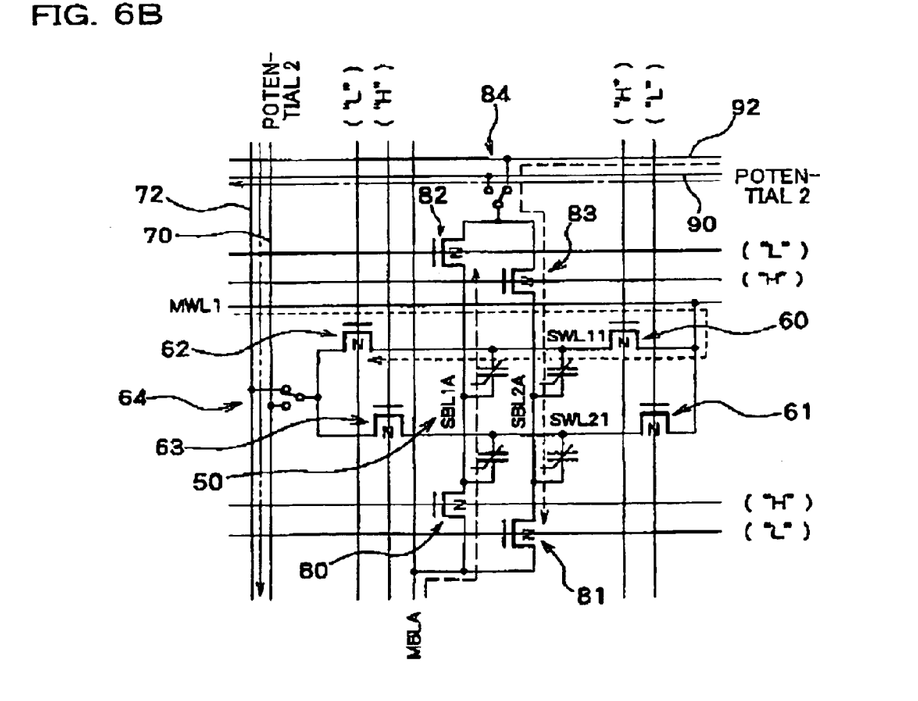
FIG. 6B shows the switching state in the selected sector shown in FIG. 6A.

FIG. 6B shows the switching state in the selected sector 12 located at a position shown in FIG. 6A. FIG. 6B shows a state in which the selected memory cell 50 in the selected sector 12 is driven.

The switches 60 to 64 and 80 to 84 shown in FIG. 6B are formed by using N-type transistors. The signal potentials of gate lines of the switches 60 to 64 and 80 to 84 are set as shown in FIG. 6B. Therefore, the switches 60, 63, 80, and 83 to which a potential "H" is applied at the gate are turned on, and the switches 61, 62, 81, and 82 to which a potential "L" is applied at the gate are turned off. The first select switch 64 selects the variable unselected wordline potential supply line 72, and the second select switch 84 selects the variable unselected bitline potential supply line 92.

This causes the selected wordline potential shown in FIG. 5A and the unselected wordline potential shown in FIG. 5C to be applied to only the selected memory cell 50 shown in FIG. 6B. Therefore, +Vs can be applied when writing "0" (or reading), and -Vs can be applied when writing "1" (or rewriting). Since the voltage applied to the unselected memory cells is ±Vs/3 at the maximum, the memory state can be maintained.

Figure 7A:
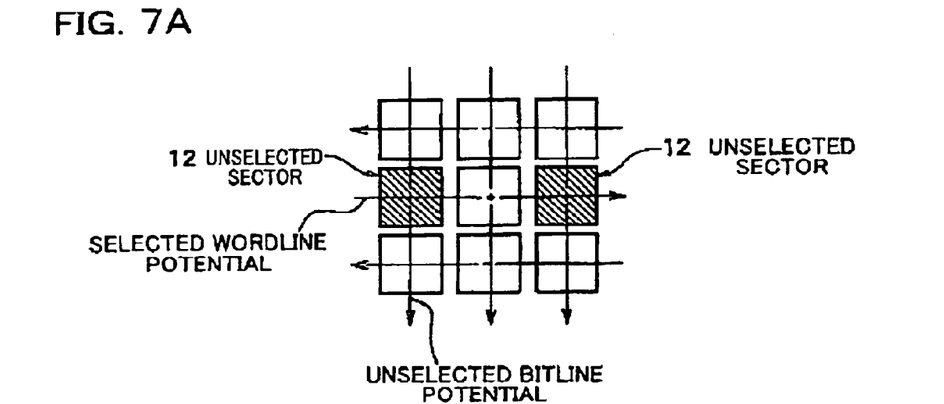
FIG. 7A shows the positions of unselected sectors located in the same row as the selected sector shown in FIG. 6A.
Figure 7B:
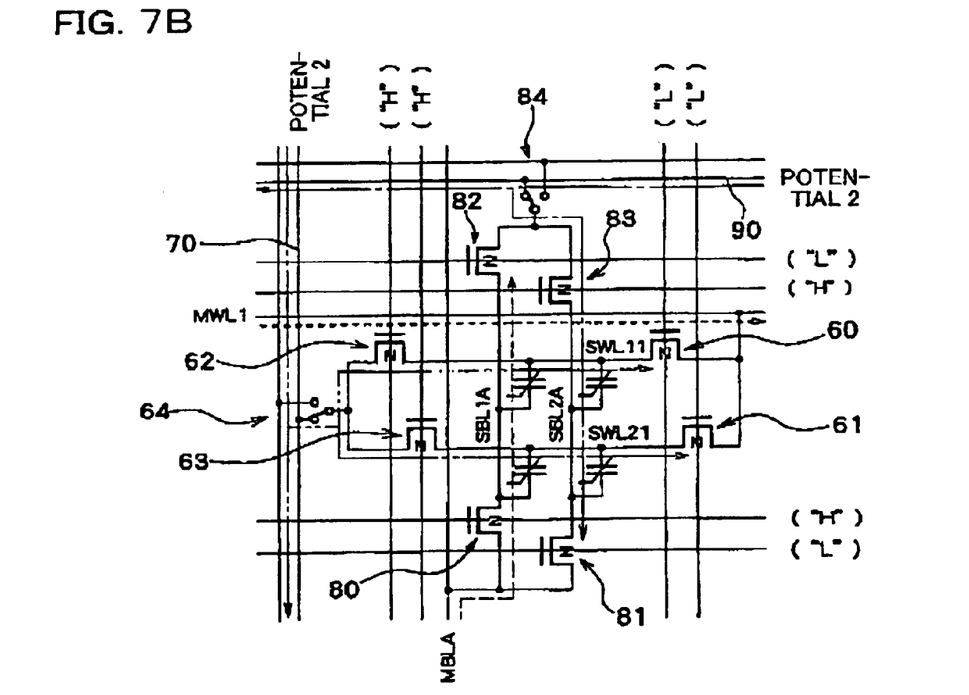
FIG. 7B shows the switching state in the unselected sector shown in FIG. 7A.

Two unselected sectors 12 shown in FIG. 7A are located in the same row as the selected sector 12 shown in FIG. 6A. FIG. 7B shows a state in which the unselected memory cells 50 in one of the unselected sectors 12 shown in FIG. 7A are driven.

In FIG. 7B, the main-wordline MWL1 corresponding to the selected memory cell 12 shown in FIG. 6B is set at the selected wordline potential shown in FIG. 5A. In FIG. 7B, the first sub-wordline select switches 60 and 61 connected with the main-wordline MWL1 are turned off. Therefore, the second sub-wordline select switches 62 and 63 are turned off), and the fixed unselected wordline potential supply line 70 set at a potential 2(Vs/3) is selected by the first select switch 64, as shown in FIG. 7B.

This causes the potential 2(Vs/3) to be supplied to the sub-wordlines SWL1A and SWL2A in the sector region 12 shown in FIG. 7B.

It is necessary to prevent occurrence of disturbance by applying 0 V to all the unselected memory cells 50 in the unselected sector 12. The unselected main-bitline MBLA shown in FIG. 7B is set at the fixed unselected bitline potential (Vs/3) shown in FIG. 5F, which is the same as the potential supplied to the sub-wordlines SWL1A and SWL2A. Therefore, the fixed potential (Vs/3) is supplied to the sub-bitline SBL1A by turning on the switch 80. In order to supply the fixed potential (Vs/3) to the other sub-bitline SBL2A, the fixed unselected bitline potential supply line 90 and the sub-bitline SBL2A are connected through the switches 83 and 84.

This causes 0 V to be applied to all the unselected memory cells 50 in the unselected sector 12, whereby occurrence of disturbance is prevented.

Figure 8A:
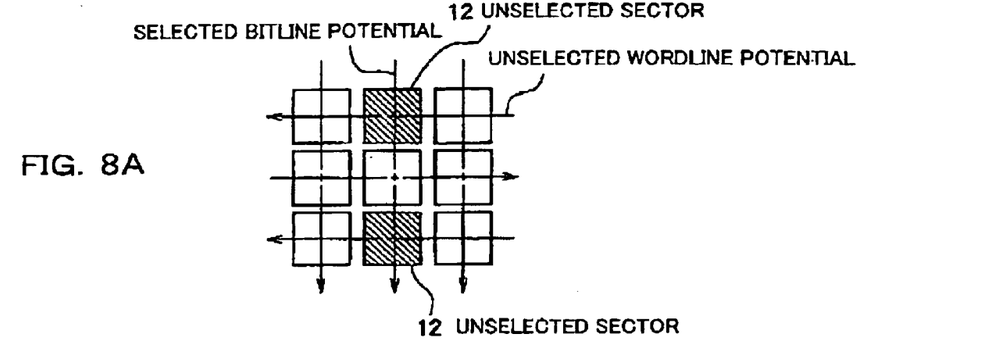
FIG. 8A shows the positions of unselected sectors located in the same column as the selected sector shown in FIG. 6A.
Figure 8B:
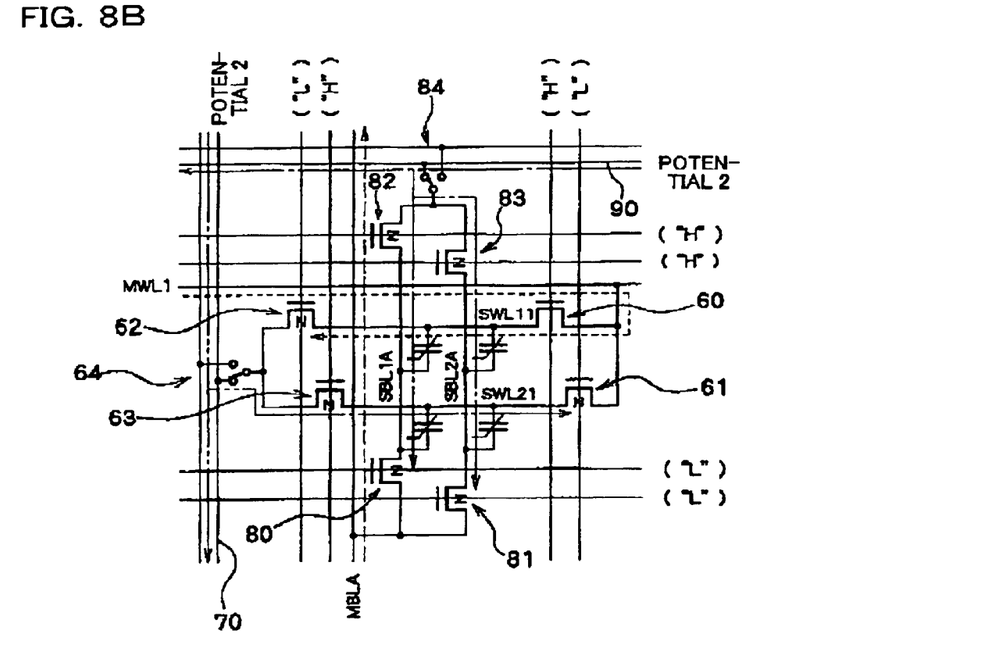
FIG. 8B shows the switching state in the unselected sector shown in FIG. 8A.

Two unselected sectors 12 shown in FIG. 8A are located in the same column as the selected sector 12 shown in FIG. 6A. FIG. 8B shows a state in which the unselected memory cells 50 in one of the unselected sectors 12 shown in FIG. 8A are driven.

In FIG. 8B, the main-bitline MBLA corresponding to the selected memory cell 12 shown in FIG. 6B is set at the selected bitline potential shown in FIG. 5C. In FIG. 8B, the first sub-bitline select switches 80 and 81 connected with the main-bitline MBLA are turned off. Therefore, the second sub-bitline select switches 82 and 83 are turned on, and the fixed unselected bitline potential supply line 90 set at a potential 2(Vs/3) is selected by the second select switch 84, as shown in FIG. 8B.

This causes the potential 2(Vs/3) to be supplied to the sub-bitlines SBL1A and SBL2A in the sector region 12 shown in FIG. 8B.

In FIG. 8B, it is necessary to prevent occurrence of disturbance by applying 0 V to all the unselected memory cells 50 in the unselected sector 12. The unselected main-wordline MWL1 shown in FIG. 8B is set at the fixed unselected wordline potential (Vs/3) shown in FIG. 5E, which is the same as the potential supplied to the sub-bitlines SBL1A and SBL2A. Therefore, the fixed potential (Vs/3) is supplied to the sub-wordline SWL11 by turning on the switch 60. In order to supply the fixed potential (Vs/3) to the other sub-wordline SWL21, the fixed unselected wordline potential supply line 70 and the sub-wordline SWL21 are connected through the switches 63 and 64.

This causes 0 V to be applied to all the unselected memory cells 50 in the unselected sector 12 shown in FIG. 8B, whereby occurrence of disturbance is prevented.

Figure 9A:
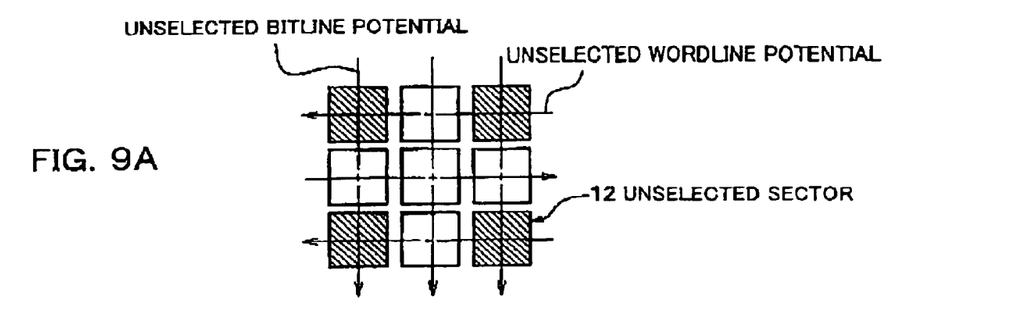
FIG. 9A shows the positions of unselected sectors located in rows and columns differing from the selected sector shown in FIG. 6A.
Figure 9B:
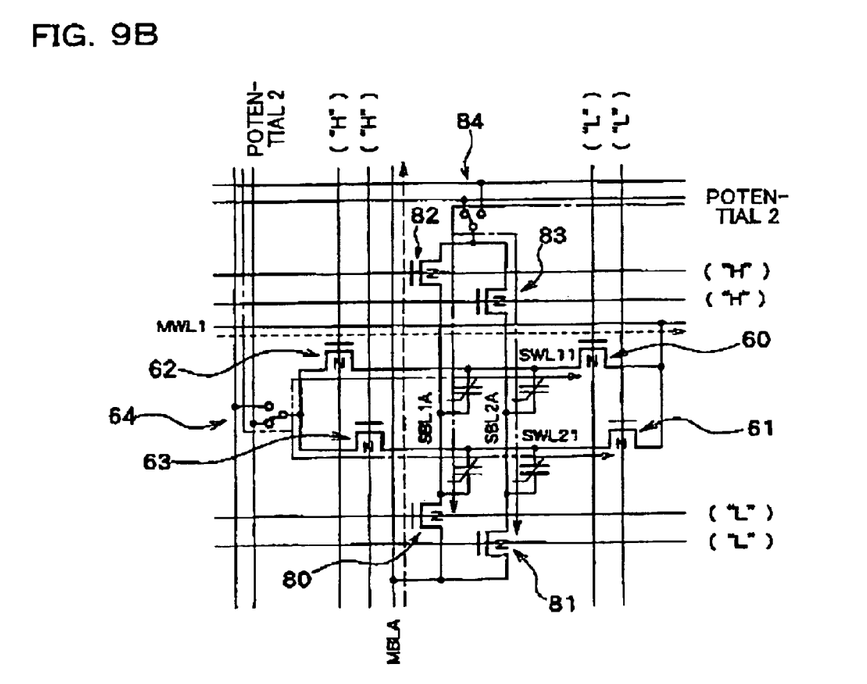
FIG. 9B shows the switching state in the unselected sector shown in FIG. 9A.

Four unselected sectors 12 shown in FIG. 9A are located in the rows and columns differing from the selected sector 12 shown in FIG. 6A. FIG. 9B shows a state in which the unselected memory cells 50 in one of the unselected sectors 12 shown in FIG. 9A are driven In the unselected sector 12 shown in FIG. 9B, it is necessary to prevent occurrence of disturbance by applying 0 V to all the unselected memory cells 50 in the unselected sector 12. In the example shown in FIG. 9B, 0 V is applied to all the unselected memory cells 50 by using the fixed unselected wordline potential supply line 70 and the fixed unselected bitline potential supply line 90.

The fixed unselected wordline potential supply line 70 and the fixed unselected bitline potential supply line 90 are respectively selected by the first and second select switches 64 and 84, and the second sub-wordline select switches 62 and 63 and the second sub-bitline select switches 82 and 83 are turned on. The first sub-wordline select switches 60 and 61 and the first sub-bitline select switches 80 and 81 are turned off.

Even if the switching state is the reverse of the above-described switching state, occurrence of distance can also be prevented by applying 0 V to all the unselected cells 50 in the unselected sector 12 shown in FIG. 9B. This is because the fixed unselected wordline potential (Vs/3) shown in FIG. 5E is supplied to the main-wordline MWL1, and the fixed unselected bitline potential (Vs/3) shown in FIG. 5F is supplied to the main-bitline MBLA.

The drive operation in the selected sector including the selected memory cell 50 shown in FIG. 6A and the drive operation in the unselected sector are described above. A period in which none of the sector regions 12 is selected is called a standby period.

In the standby period, the state of the sector region 12 shown in FIG. 9B is realized in all the sector regions. Specifically, the first sub-bitline select switches 80 and 81 and the first sub-wordline select switches 60 and 61 are turned off, and the second sub-bitline select switches 82 and 83 and the second sub-wordline select switches 62 and 63 are turned on in all the sector regions 12. This causes 0 V to be applied to all the memory cells in all the sector regions, whereby occurrence of disturbance can be prevented.

During inspection, the first sub-bitline select switches 80 and 81 and the first sub-wordline select switches 60 and 61 may be turned on, and the second sub-bitline select switches 82 and 83 and the second sub-wordline select switches 62 and 63 may be turned off in the sector region 12 which is the target of inspection. This enables a logical value "0" or "1" to be written into all the memory cells at the same time during inspection.

In the case where a defect is found in one sector region after inspection, all the first and second sub-wordline select switches 60 to 63 and 80 to 83 in the defective sector region may be turned off. This causes the defective sector region to be in a high impedance state, whereby a signal is not input and a leakage does not occur.

The first and second sub-bitline select switches and the first and second sub-wordline select switches may be turned off during a potential change transition period immediately after turning the power on. This prevents an unexpected excessive voltage from being applied to the memory cells.

The present invention is not limited to the above-described embodiments. Various modifications and variations are possible within the spirit and scope of the present invention.

The above-described embodiment illustrates an example in which the sector region is simplified for convenience of illustration. A plurality of main-wordlines and a plurality of main-bitlines are disposed in the actual sector region 12.

Figure 10:
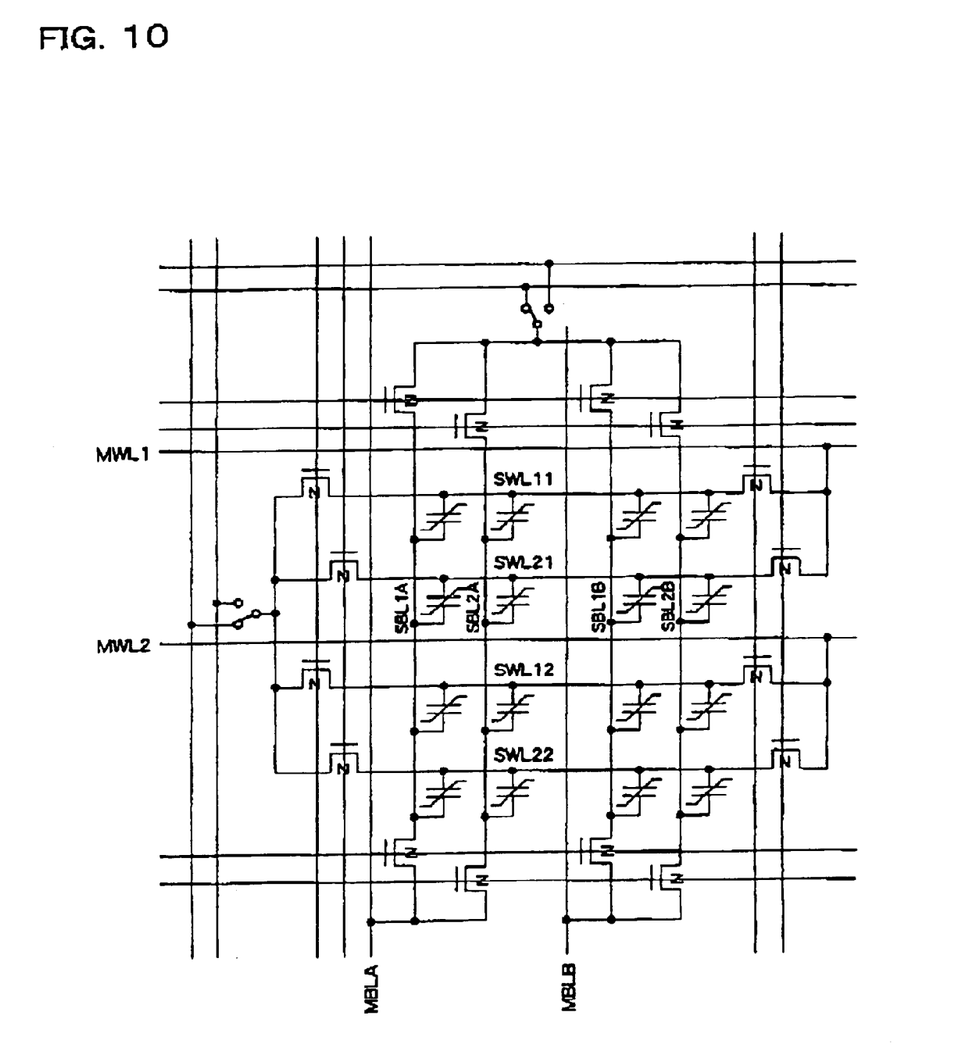
FIG. 10 is a schematic diagram showing a modification in which a plurality of main-wordlines and a plurality of main-bitlines are provided in one sector region.

FIG. 10 shows a minimum unit of the sector region. FIG. 10 shows two main-wordlines MWL1 and MWL2 and sub-wordlines SWL11 and SWL21 and sub-wordlines SWL12 and SWL22 provided for the main-wordlines MWL1 and MWL2, respectively. FIG. 10 also shows two main-bitlines MBLA and MBLB and sub-bitlines SBL1A and SBL2A and sub-bitlines SBL1B and SBL2B provided for the main-bitlines MBLA and MBLB, respectively.

What is claimed is:

1. A ferroelectric memory device comprising:

a memory cell array region divided into a plurality of sector regions in row and column directions;

a plurality of main-wordlines disposed in the memory cell array region in parallel along the row direction;

a plurality of main-bitlines disposed in the memory cell array region in parallel along the column direction;

a plurality of sub-wordlines, each of the sub-wordlines being provided for one of the main-wordlines in one of the sector regions;

a plurality of sub-bitlines, each of the sub-bitlines being provided for one of the main-bitlines in one of the sector regions;

a plurality of ferroelectric memory cells, each of the ferroelectric memory cells being disposed at an intersecting point of one of the sub-wordlines provided for one of the main-wordlines and one of the sub-bitlines provided for one of the main-bitlines;

a plurality of first sub-wordline select switches, each of the first sub-wordline select switches being disposed between one of the main-wordlines and one end of one of the sub-wordlines provided for the one main-wordline and being driven independently at least in one of the sector regions;

a plurality of first sub-bitline select switches, each of the first sub-bitline select switches being disposed between one of the main-bitlines and one end of one of the sub-bitlines provided for the one main-bitline and being driven independently at least in one of the sector regions;

at least one unselected wordline potential supply line which supplies an unselected wordline potential to the sub-wordlines;

at least one unselected bitline potential supply line which supplies an unselected bitline potential to the sub-bitlines;

a plurality of second sub-wordline select switches, each of the second sub-wordline select switches being disposed between the other end of one of the sub-wordlines and the unselected wordline potential supply line and being driven independently at least in one of the sector regions; and a plurality of second sub-bitline select switches, each of the second sub-bitline select switches being disposed between the other end of one of the sub-bitlines and the unselected bitline potential supply line and being driven independently at least in one of the sector regions.

2. The ferroelectric memory device as defined in claim 1, further comprising:

a plurality of first sector select sections, each of the first sector select sections being provided for the sector regions arranged along the column direction; and a plurality of second sector select sections, each of the second sector select sections being provided for the sector regions arranged along the row direction;

wherein when a selected first sector select section is selected from among the plurality of first sector select sections and a selected second sector select section is selected from among the plurality of second sector select sections, the selected first sector select section and the selected second sector select section turn on and turn off the first and second sub-wordline select switches and the first and second sub-bitline select switches so that a select voltage is applied to a selected memory cell in a selected sector region through one of the main-wordlines and one of the main-bitlines, and turn on and turn off the first and second sub-wordline select switches and the first and second sub-bitline select switches so that an unselect voltage is applied to an unselected memory cell in the selected sector region through at least one of the unselected wordline potential supply line and the unselected bitline potential supply line, the selected memory cell and the unselected memory cell being memory cells among the plurality of the ferroelectric memory cells, and the selected sector region being selected from among the plurality of the sector regions.

3. The ferroelectric memory device as defined in claim 2, wherein the selected first sector select section turns on one of the first sub-wordline select switches that is connected with one of the sub-wordlines provided for the selected memory cell and turns off rest of the first sub-wordline select switches in the selected sector region, and turns on one of the second sub-wordline select switches that is connected with one of the sub-wordlines provided for the selected memory cell and turns off rest of the second sub-wordline select switches in the selected sector region, and wherein the selected second sector select section turns on one of the first sub-bitline select switches that is connected with one of the sub-bitlines provided for the selected memory cell and turns off rest of the first sub-bitline select switches in the selected sector region, and turns on one of the second sub-bitline select switches that is connected with one of the sub-bitlines provided for the selected memory cell and turns off rest of the second sub-bitline select switches in the selected sector region.

4. The ferroelectric memory device as defined in claim 2, wherein one of the first sector select sections provided for an unselected sector region that shares one of the main-wordlines with the selected sector region turns off the first sub-wordline select switches and turns on the second sub-wordline select switches, the unselected sector region being a sector region other than the selected sector regions among the plurality of the sector regions.

5. The ferroelectric memory device as defined in claim 2, wherein one of the second sector select sections provided for an unselected sector region that shares one of the main-bitlines with the selected sector region turns off the first sub-bitline select switches and turns on the second sub-bitline select switches, the unselected sector region being a sector region other than the selected sector regions among the plurality of the sector regions.

6. The ferroelectric memory device as defined in claim 2, wherein the first sector select section provided for an unselected sector region that does not share one of the main-wordlines and one of the main-bitlines with the selected sector region turns off the first sub-wordline select switches and turns on the second sub-wordline select switches, the unselected sector region being a sector region other than the selected sector region among the plurality of sector regions, and wherein the second sector select section provided for an unselected sector region that does not share one of the main-wordlines and one of the main-bitlines with the selected sector region turns off the first sub-bitline select switches and turns on the second sub-bitline select switches, the unselected sector region being a sector region other than the selected sector region among the plurality of sector regions.

7. The ferroelectric memory device as defined in claim 4, wherein potentials of the sub-wordlines and the sub-bitlines connected with all of the unselected memory cells in the unselected sector region are substantially the same.

8. The ferroelectric memory device as defined in claim 1, wherein, during a standby period in which none of the sector regions are selected, the first sub-bitline select switches and the first sub-wordline select switches are turned off, and the second sub-bitline select switches and the second sub-wordline select switches are turned on in all of the sector regions.

9. The ferroelectric memory device as defined in claim 8, wherein potentials of the unselected wordline potential supply line and the unselected bitline potential supply line are substantially the same during the standby period.

10. The ferroelectric memory device as defined in claim 1,
   wherein, during an inspection period, the first sub-bitline select switches and the fit sub-wordline select switches are turned on, and the second sub-bitline select switches and the second sub-wordline select switches are turned off in a sector region that is a target of inspection among the plurality of the sector regions.

11. The ferroelectric memory device as defined in claim 1, wherein the first sub-bitline select switches, the first sub-wordline select switches, the second sub-bitline select switches, and the second sub-wordline select switches are turned off in a defective sector region among the plurality of the sector regions.

12. The ferroelectric memory device as defied in claim 1,
   wherein the unselected wordline potential supply lines include a variable unselected wordline potential supply line which supplies a variable unselected wordline potential to the sub-wordlines, and a fixed unselected wordline potential supply line which supplies a fixed unselected wordline potential to the sub-wordlines,
   wherein the unselected bitline potential supply lines include a variable unselected bitline potential supply line which supplies a variable unselected bitline potential to the sub-bitlines, and a fixed unselected bitline potential supply line which supplies a fixed unselected bitline potential to the sub-bitlines, and
   wherein the ferroelectric memory device further includes:
   a plurality of unselected wordline potential select switches which are provided for the sector regions arranged in the column direction and select one of the variable and fixed unselected wordline potential supply lines; and
   a plurality of unselected bitline potential select switches which are provided for the sector regions arranged in the row direction and select one of the variable and fixed unselected bitline potential supply lines.

13. The ferroelectric memory device as defined in claim 2,
   wherein the unselected wordline potential supply lines includes a variable unselected wordline potential supply line which supplies a variable unselected wordline potential to the sub-wordlines, and a fixed unselected wordline potential supply line which supplies a fixed unselected wordline potential to the sub-wordlines,
   wherein the unselected bitline potential supply lines includes a variable unselected bitline potential supply line which supplies a variable unselected bitline potential to the sub-bitlines, and a fixed unselected bitline potential supply line which supplies a fixed unselected bitline potential to the sub-bitlines, and
   wherein the ferroelectric memory device further includes:
   a plurality of unselected wordline potential select switches which are provided for the sector regions arranged in the column direction and select one of the variable and fixed unselected wordline potential supply lines; and
   a plurality of unselected bitline potential select switches which are provided for the sector regions arranged in the row direction and select one of the variable and fixed unselected bitline potential supply lines.

14. The ferroelectric memory device as defined in claim 13,
   wherein the selected first sector select section turns on one of the first sub-wordline select switches that is connected with one of the sub-wordlines provided for the selected memory cell and turns off rest of the first sub-wordline select switches in the selected sector region, and turns on one of the second sub-wordline select switches that is connected with one of the sub-wordlines provided for the selected memory cell and turns off rest of the second sub-wordline select switches in the selected sector region, and the variable unselected bitline potential supply line is selected by one of the unselected bitline potential select switches provided for the selected sector region, and
   wherein the selected second sector select section turns on one of the first sub-bitline select switches that is connected with one of the sub-bitlines provided for the selected memory cell and turns off rest of the first sub-bitline select switches in the selected sector region, and turns on one of the second sub-bitline select switches that is connected with one of the sub-bitlines provided for the selected memory cell and turns off rest of the second sub-bitline select switches in the selected sector region, and the variable unselected wordline potential supply line is selected by one of the unselected wordline potential select switches provided for the selected sector region.

15. The ferroelectric memory device as defined in claim 13,
   wherein one of the first sector select sections provided for an unselected sector region that shares one of the main-wordlines with the selected sector region turns off the first sub-wordline select switches and turns on the second sub-wordline select switches, the unselected sector region being a sector region other than the selected sector regions among the plurality of the sector regions, and the fixed unselected bitline potential supply line is selected by one of the unselected bitline potential select switches provided for the unselected sector region that shares one of the main-wordlines with the selected sector region.

16. The ferroelectric memory device as defined in claim 13,
   wherein one of the second sector select sections provided for an unselected sector region that shares one of the main-bitlines with the selected sector region turns off the first sub-bitline select switches and turns on the second sub-bitline select switches, the unselected sector region being a sector region other than the selected sector regions among the plurality of the sector regions, and the fixed unselected wordline potential supply line is selected by one of the unselected wordline potential select switches provided for the unselected sector region that shares one of the main-bitlines with the selected sector region.

17. The ferroelectric memory device as defined in claim 13,
   wherein the first sector select section provided for an unselected sector region that does not share one of the main-wordlines and one of the main-bitlines with the selected sector region turns off the first sub-wordline select switches and turns on the second sub-wordline select switches, the unselected sector region being a sector region other than the selected sector region among the plurality of sector regions, and the fixed unselected bitline potential supply line is selected by one of the unselected bitline potential select switches provided for the unselected sector region that does not share one of the main-wordlines and one of the main-bitlines with the selected sector region, and wherein the second sector select section provided for the unselected sector region that does not share one of the main-wordlines and one of the main-bitlines with the selected sector region turns off the first sub-bitline select switches and turns on the second sub-bitline select switches, and the fixed unselected wordline potential supply line is selected by one of the unselected wordline potential select switches provided for the unselected sector region that does not share one of the main-wordlines and one of the main-bitlines with the selected sector region.

* * * * *